United States Patent
Wang et al.

(10) Patent No.: US 10,069,422 B2
(45) Date of Patent: Sep. 4, 2018

(54) SYNCHRONOUS SWITCHING CONVERTER AND ASSOCIATED INTEGRATED SEMICONDUCTOR DEVICE

(71) Applicant: Chengdu Monolithic Power Systems Co., Ltd., Chengdu (CN)

(72) Inventors: Huaifeng Wang, Chengdu (CN); Eric Braun, Mountain View, CA (US)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days.

(21) Appl. No.: 15/448,376

(22) Filed: Mar. 2, 2017

(65) Prior Publication Data

US 2017/0257032 A1   Sep. 7, 2017

(30) Foreign Application Priority Data

Mar. 3, 2016  (CN) .......................... 2016 1 0119048

(51) Int. Cl.
*H02M 3/158* (2006.01)
(52) U.S. Cl.
CPC ................................ *H02M 3/1588* (2013.01)
(58) Field of Classification Search
None
See application file for complete search history.

(56) References Cited

U.S. PATENT DOCUMENTS

| | | | | |
|---|---|---|---|---|
| 7,675,281 B1 * | 3/2010 | Holt | ..................... | H02M 3/1588 323/282 |
| 2005/0052887 A1 * | 3/2005 | Matsuo | .................. | H02M 3/156 363/127 |
| 2006/0152204 A1 * | 7/2006 | Maksimovic | ........... | H02M 1/38 323/284 |
| 2006/0164057 A1 * | 7/2006 | Kudo | .................. | H02M 3/1588 323/282 |
| 2007/0290729 A1 * | 12/2007 | Chen | ........................ | H03K 7/08 327/172 |
| 2008/0191677 A1 * | 8/2008 | Bacchi | .................. | H02M 3/156 323/282 |
| 2009/0122585 A1 * | 5/2009 | Karasawa | ........... | H02M 3/1588 363/127 |
| 2013/0341705 A1 | 12/2013 | Raghavan | | |
| 2014/0103416 A1 | 4/2014 | Wang | | |

* cited by examiner

*Primary Examiner* — Henry Lee, III
(74) *Attorney, Agent, or Firm* — Perkins Coie LLP (57) ABSTRACT

A synchronous switching converter has an integrated semiconductor device. The integrated semiconductor device has a first semiconductor component and a second semiconductor component coupled in parallel. The first semiconductor component has MOSFET cells with body diodes, and the second semiconductor component has diode cells or MOSFET cells with a low forward voltage. Cells of the second semiconductor component distribute among the first semiconductor component unevenly according to a distribution of a current flowing through the integrated semiconductor device.

16 Claims, 5 Drawing Sheets

SYNCHRONOUS SWITCHING CONVERTER AND ASSOCIATED INTEGRATED SEMICONDUCTOR DEVICE

This application claims the benefit of CN application No. 201610119048.3, filed on Mar. 3, 2016, and incorporated herein by reference.

TECHNICAL FIELD

The present invention relates to electrical circuit, more particularly but not exclusively relates to synchronous switching converter.

BACKGROUND

With the development of electronic equipments, semiconductor devices are widely used in various switching converters. For example, a step-down synchronous switching converter has an input terminal, a high-side switch and a low-side synchronous switch coupled between the input terminal and a system ground, wherein the high-side switch and the low-side synchronous switch are both semiconductor devices. The step-down synchronous switching converter is configured to convert an input voltage to a pulse signal according to a duty ratio and generate a stable DC output voltage via an output filter circuit, wherein the duty ratio is controlled by the high-side switch and the low-side synchronous switch. However, turn on losses of the low-side synchronous switch are large due to a high forward voltage of its body diode, and a slow reverse recovery of the body diode further increases its dynamic losses, so it's difficult to improve the step-down synchronous switching converter's efficiency.

SUMMARY

It is one of the objects of the present invention to provide a synchronous switching converter and associated integrated semiconductor device.

One embodiment of the present invention discloses an integrated semiconductor device utilized in synchronous switching converters, comprising: a first semiconductor component, comprising a first Metal Oxide Semiconductor Field Effect Transistor (MOSFET) with a body diode, wherein the first MOSFET has a source, a drain and a gate; and a second semiconductor component, coupled in parallel with the first semiconductor component, wherein the second semiconductor component comprises a diode with an anode and a cathode, wherein the anode of the diode is coupled to the source of the first MOSFET, the cathode of the diode is coupled to the drain of the first MOSFET, wherein a forward voltage of the diode is lower than a forward voltage of the body diode in the first MOSFET; wherein cells of the second semiconductor component are configured to distribute among the first semiconductor component unevenly according to a distribution of a current flowing through the integrated semiconductor device.

Another embodiment of the present invention discloses an integrated semiconductor device utilized in synchronous switching converters, comprising: a first semiconductor component, comprising a first Metal Oxide Semiconductor Field Effect Transistor (MOSFET) with a body diode, wherein the first MOSFET has a source, a drain and a gate; and a second semiconductor component, coupled in parallel with the first semiconductor component, wherein the second semiconductor component comprises a second MOSFET, the second MOSFET has a source, a drain and a gate, wherein the drain of the second MOSFET in the second semiconductor component is coupled to the drain of the first MOSFET, both the source and the gate of the second are coupled to the source of the first MOSFET, and a threshold voltage of the second MOSFET is lower than a threshold voltage of the first MOSFET, wherein the threshold voltage of the first MOSFET is a lowest voltage needed to turn on the first MOSFET, the threshold voltage of the second MOSFET is a lowest voltage needed to turn on the second MOSFET; wherein cells of the second semiconductor component are configured to distribute among the first semiconductor component unevenly according to a distribution of a current flowing through the integrated semiconductor device.

Yet another embodiment of the present invention discloses a synchronous switching converter, having an input terminal and an output terminal utilized to provide an output signal, the synchronous switching converter comprising: an input capacitor, having a first terminal and a second terminal, wherein the first terminal is coupled to the input terminal, the second terminal is coupled to a system ground; a power switch, configured to adjust the output signal; an inductor, configured to store energy when the power switch is on and release energy when the power switch is off; a synchronous switch, configured to be an integrated semiconductor device to provide a path for a current of the inductor when the power switch is off, wherein the integrated semiconductor device comprises a first semiconductor component and a second semiconductor component coupled in parallel, cells of the second semiconductor component are configured to distribute among the first semiconductor component unevenly according to a distribution of a current flowing through the inductor; and an output capacitor, having a first terminal and a second terminal, wherein the first terminal of the output capacitor is coupled to the output terminal, the second terminal of the output capacitor is coupled to the system ground.

According to the embodiments of the present invention, the synchronous switching converter has a high efficiency and an optimized reduction of losses.

BRIEF DESCRIPTION OF THE DRAWINGS

Non-limiting and non-exhaustive embodiments are described with reference to the following drawings.

DETAILED DESCRIPTION

In the present application, numerous specific details are described to provide a thorough understanding of the present invention, such as examples of circuits, components, and methods. These embodiments illustrated are exemplary, not to confine the scope of the invention. Persons of ordinary skill in the art will recognize, however, that the invention can be implemented without one or more of the specific details. In other instances, well-known details are not shown or described to avoid obscuring the aspects of the invention. Some phrases are used in some exemplary embodiments. However, the usage of these phrases is not confined to these embodiments.

Figure 1:
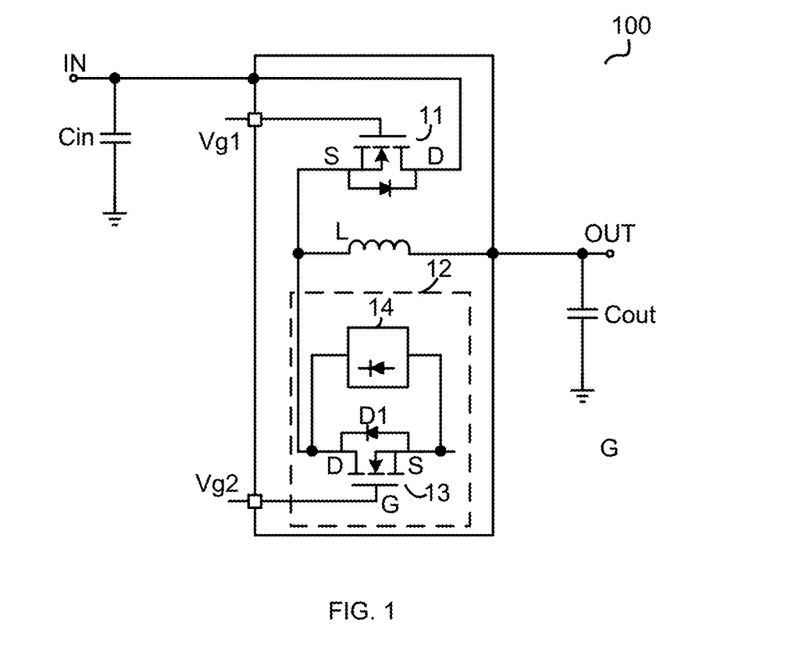
FIG. 1 schematically illustrates a circuit block diagram of a switching converter 100 according to an embodiment of the present invention.

FIG. 1 schematically illustrates a circuit block diagram of a switching converter 100 according to an embodiment of the present invention. The synchronous switching converter 100 comprises an input terminal IN configured to receive an input voltage, an input capacitor Cin coupled between the input terminal IN and a system ground, an output terminal OUT, an output capacitor Cout coupled between the output terminal OUT and the system ground, an inductor L, a power switch 11 and a synchronous switch 12. The inductor L is configured to store energy when the power switch 11 is on and release energy when the power switch 11 is off. An output signal provided by the output terminal OUT can be adjusted by the power switch 11. In another embodiment, the power switch 11 can be a Metal Oxide Semiconductor Field Effect Transistor (MOSFET) or other semiconductor devices. In an embodiment as shown in FIG. 1, the power switch 11 comprises a source S, a drain D and a gate G, wherein the gate G of the power switch 11 is configured to receive a switch control signal Vg1. The synchronous switch 12 is configured to be a path for a current flowing through the inductor L when the power switch 11 is off. The synchronous switch 12 comprises a first semiconductor component 13 and a second semiconductor component 14 coupled in parallel. The first semiconductor component 13 can be a first MOSFET with a body diode D1, wherein the first MOSFET has a source S, a drain D and a gate G, and the gate G of the first MOSFET is configured to receive a switch control signal Vg2. The second semiconductor component 14 can be a fast recovery diode or a second MOSFET with a low threshold voltage, wherein the threshold voltage is a lowest voltage needed to turn on the second MOSFET. In one embodiment, the second semiconductor component 14 comprises a schottky diode, wherein its anode is coupled to the source S of the first MOSFET in the first semiconductor component 13, and its cathode is coupled to the drain D of the first MOSFET in the first semiconductor component 13, and a forward voltage of the schottky diode is lower than a forward voltage of the body diode D1 in the first MOSFET. In another embodiment, the second semiconductor component 14 comprises a second MOSFET with a low threshold voltage.

Figure 2:
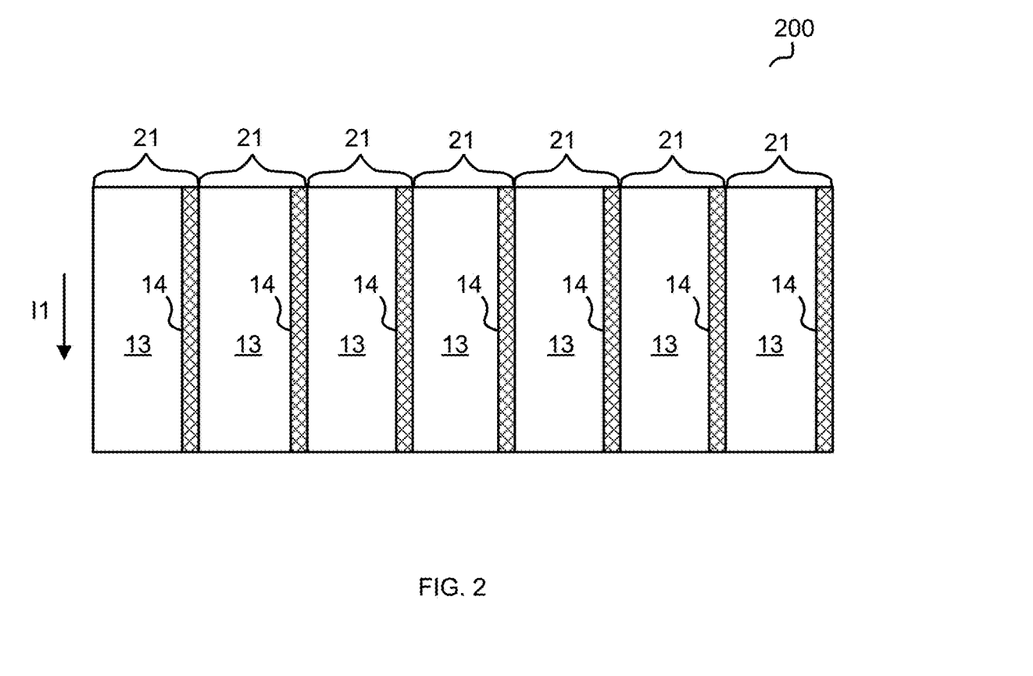
FIG. 2 schematically illustrates a layout 200 of a synchronous switch 12 as shown in FIG. 1 according to an embodiment of the present invention.

FIG. 2 schematically illustrates a layout 200 of the synchronous switch 12 as shown in FIG. 1 according to an embodiment of the present invention. In one embodiment as shown in FIG. 2, cells of the second semiconductor component 14 are configured to distribute among the first semiconductor component 13 uniformly. The synchronous switch 12 comprises multiple semiconductor cells 21, wherein each of the semiconductor cells 21 is formed by the first semiconductor component 13 and the second semiconductor component 14 which are coupled in parallel. And for each semiconductor cell 21, both of the semiconductor component 13 and the semiconductor component 14 are configured to distribute in the layout 200 uniformly based on an area ratio of the second semiconductor component 14 to the first semiconductor component 13.

However, in practical applications, there are parasitic capacitors unevenly distributing in the packages of Printed Circuit Boards (PCBs) and Integrated Circuits (ICs), so the current I1 of the synchronous switch 12 is nonuniform. As the embodiments shown in FIG. 3a-FIG. 3e, cells of the second semiconductor component 14 are configured to distribute among the first semiconductor component 13 unevenly according to a distribution of the current I1 flowing through the synchronous switch 12. In one embodiment, the area ratio of the second semiconductor component 14 to the first semiconductor component 13 is configured to change along with the variation of the current I1, so the dynamic losses are reduced when the turn on losses and other performances of the synchronous switch 12 remain unchanged, thus improving the transmission efficiency of the current I1. In one embodiment, synchronous switch 12 is configured to be an integrated semiconductor device, wherein the integrated semiconductor device comprises at least a first cell of the second semiconductor component 13 and a second cell of the second semiconductor component 14, an area of the second cell of the second semiconductor component 14 is larger than an area of the first cell of the second semiconductor component 13 when a current flowing through the second cell of the second semiconductor component 14 is larger than a current flowing through the first cell of the second semiconductor component 13.

Figure 3A:
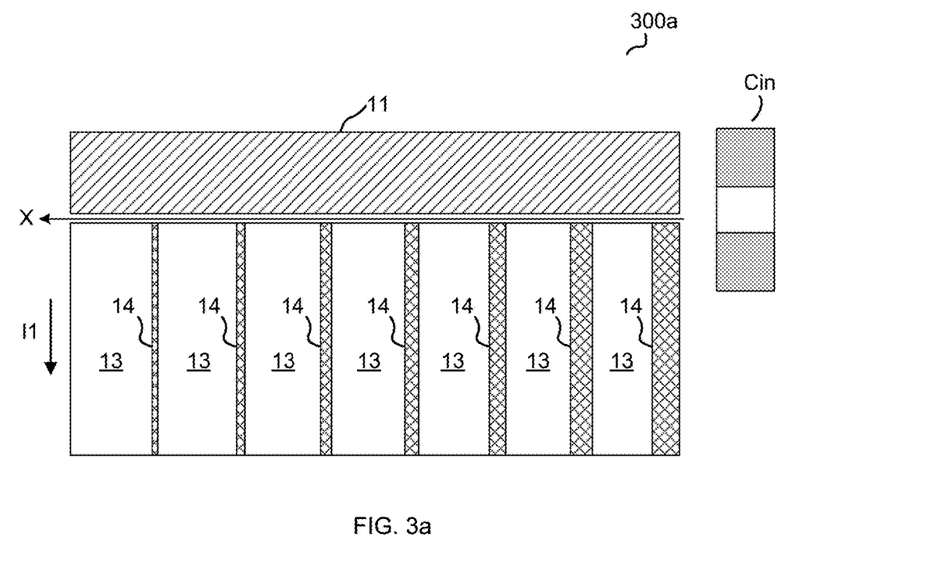
FIG. 3a-FIG. 3e schematically illustrate layouts 300a-300e of a power switch 11, a synchronous switch 12 and an input capacitor Cin as shown in FIG. 1 according to an embodiment of the present invention.
Figure 3B:
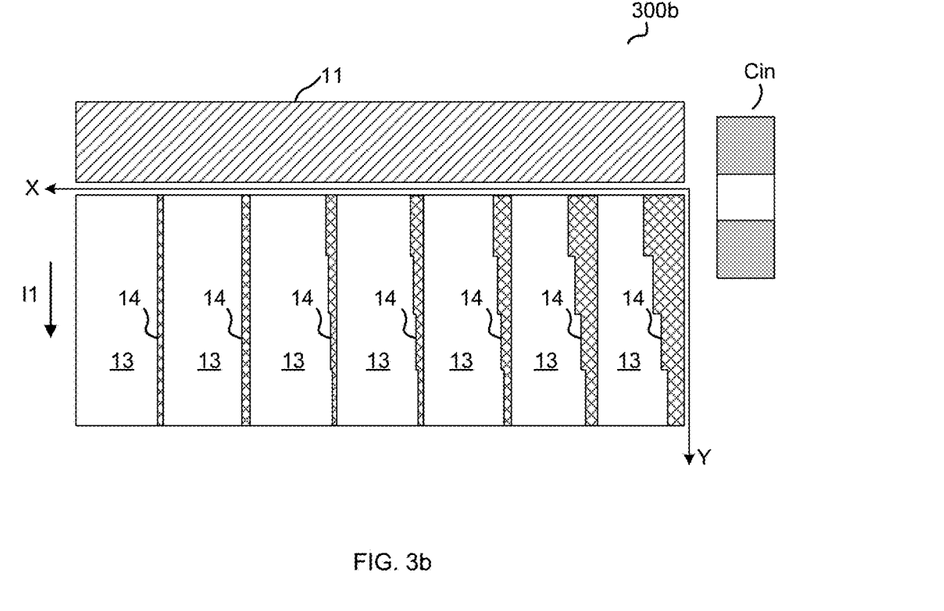
Figure 3C:
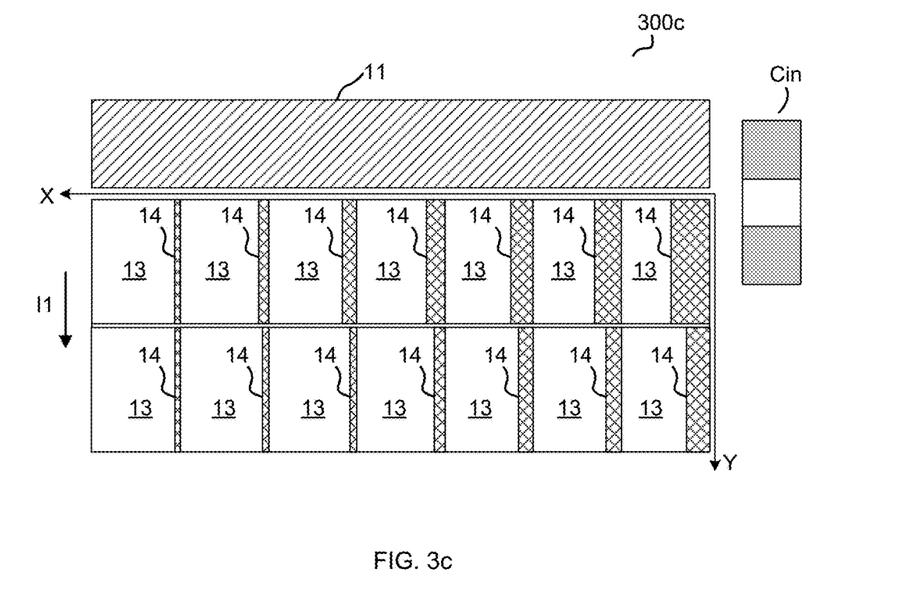
Figure 3D:
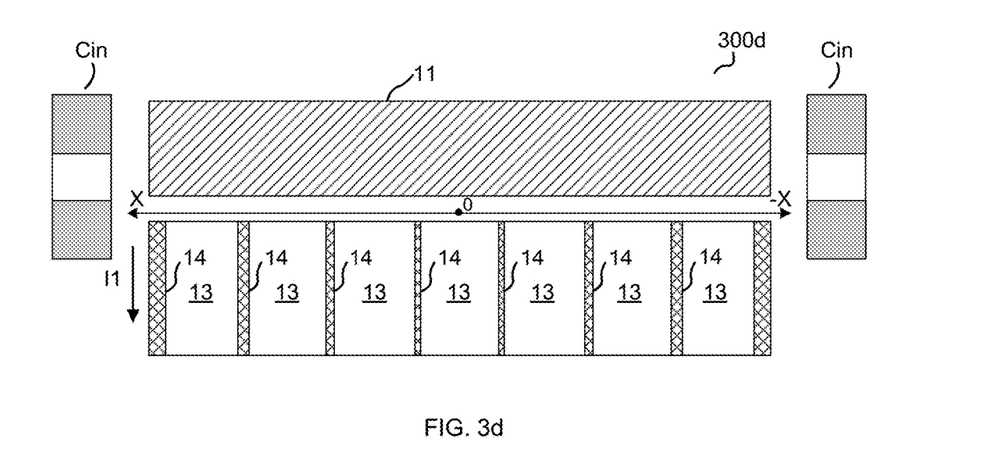
Figure 3E:
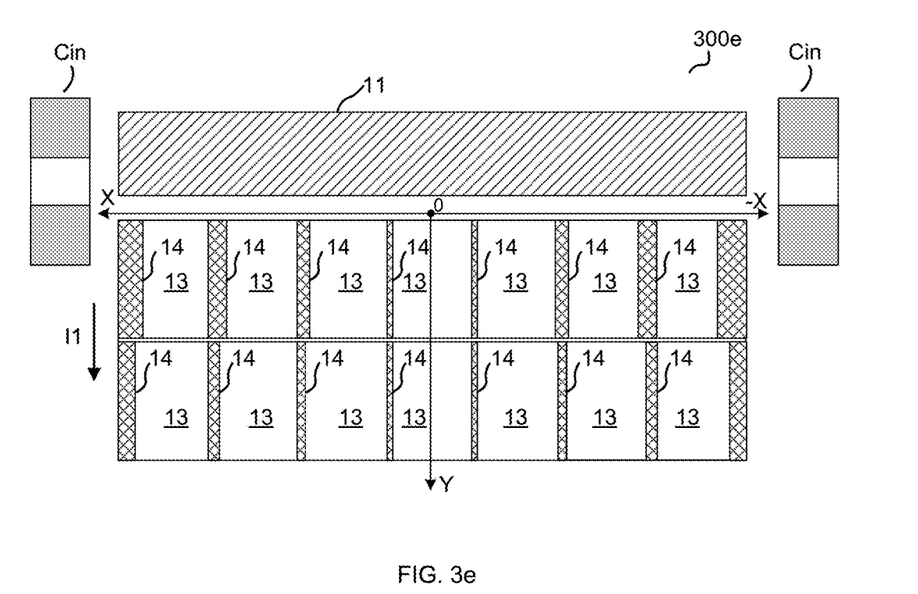

FIG. 3a-FIG. 3e schematically illustrate layouts 300a-300e of the power switch 11, synchronous switch 12 and input capacitor Cin as shown in FIG. 1 according to an embodiment of the present invention. In the embodiments as shown in FIG. 3a-FIG. 3e, cells of the second semiconductor component 14 are configured to distribute among the first semiconductor component 13 unevenly according to the distribution of the current I1 flowing through the synchronous switch 12. Wherein an area of the cell of the second semiconductor component 14 increases when a distance of the cell of the second semiconductor component 13 to the input capacitor Cin increases because that the closer to the input capacitor Cin, the larger the current I1 is, and the farther to the input capacitor Cin, the smaller the current I1 is. In the embodiment as shown in FIG. 3a, in a direction of X, the farther to the input capacitor Cin, the less area ratio of the second semiconductor component 14 to the first semiconductor component 13 is, wherein the direction of X is perpendicular to the current I1. In the embodiments as shown in the FIG. 3a-FIG. 3e, in the direction of X, the farther to the input capacitor Cin, the less area ratio of the second semiconductor component 14 to the first semiconductor component 13 is. In the embodiments as shown in FIG. 3b, FIG. 3c and FIG. 3d, in a direction of Y, the farther to the input capacitor Cin, the less area ratio of the second semiconductor component 14 to the first semiconductor component 13 is, wherein the direction of Y is parallel to the current I1. In the embodiment as shown in FIG. 3d, the area ratio of the second semiconductor component 14 to the first semiconductor component 13 is configured to increase in both directions of 0 to X and 0 to −X. In the embodiment as shown in FIG. 3e, the area ratio of the second semiconductor component 14 to the first semiconductor component 13 is configured to increase in both directions of 0 to X and 0 to −X and decrease in a direction of 0 to Y, wherein the direction of 0 to X is opposite to the direction of 0 to –X, and the direction of 0 to Y is perpendicular to both the directions of 0 to X and 0 to –X.

Figure 4:
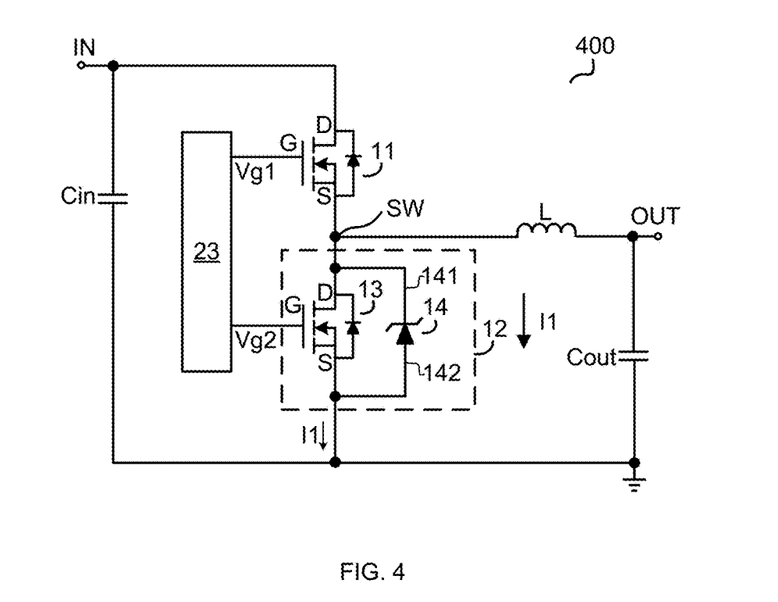
FIG. 4 schematically illustrates a circuit block diagram of a synchronous switching converter 400 according to an embodiment of the present invention.

FIG. 4 schematically illustrates a circuit block diagram of a synchronous switching converter 400 according to an embodiment of the present invention. In the embodiment as shown in FIG. 4, a step-down synchronous switching converter is configured to illustrate the synchronous switching converter 400. Nevertheless, as persons ordinary skilled in the art know, the synchronous switching converter 400 can comprise other topologies, such as a step-up synchronous switching converter, a step-up and step-down synchronous switching converter, and a flyback synchronous switching converter. The synchronous switching converter 400 comprises an input terminal IN configured to receive the input voltage, an output terminal OUT configured to provide the output voltage, an input capacitor Cin, a power switch 11, a synchronous switch 12 composed by the first semiconductor component 13 and the second semiconductor component 14, a control circuit 23, an inductor L and an output capacitor Cout. The input capacitor Cin comprises a first terminal and a second terminal, wherein the first terminal of the input capacitor Cin is coupled to the input terminal IN, and the second terminal of the input capacitor Cin is coupled to the system ground. The drain D of the power switch 11 is coupled to the input terminal IN, the source S of the power switch 11 is coupled to a node SW, and the gate G of the power switch 11 is coupled to the control circuit 23 to receive the first switch control signal Vg1. The drain D of the first MOSFET in the first semiconductor component 13 configured to be the drain of the synchronous switch 12 is coupled to both the source S of the power switch 11 and the node SW. The source S of the first MOSFET in the first semiconductor component 13 configured to be the source of the synchronous switch 12 is coupled to the system ground. And the gate G of the first MOSFET in the first semiconductor component 13 is coupled to the control circuit 23 to receive the second switch control signal Vg2. The second semiconductor component 14 comprises a schottky diode, wherein a cathode 141 of the schottky diode is coupled to the drain D of the first MOSFET in the first semiconductor component 13, and an anode 142 of the schottky diode is coupled to the source S of the first MOSFET in the first semiconductor component 13. One terminal of the inductor L is coupled to the node SW, and the other terminal of the inductor L is coupled to the output terminal OUT. One terminal of the output capacitor Cout is coupled to the output terminal OUT, and the other terminal of the output capacitor Cout is coupled to the system ground. In one embodiment, the forward voltage of the schottky diode is less than the forward voltage of the body diode in the first semiconductor component 13. Compared with the first semiconductor component 13, the second semiconductor component 14 stores less minority carriers when turns on, and the charge of the second semiconductor component 14 is lower than the charge of the first semiconductor component 13 during the reverse recovery, thus increasing the speed of the reverse recovery. Owning to the second semiconductor component 14, the dynamic losses of the first semiconductor component 13 is decreased.

Figure 5:
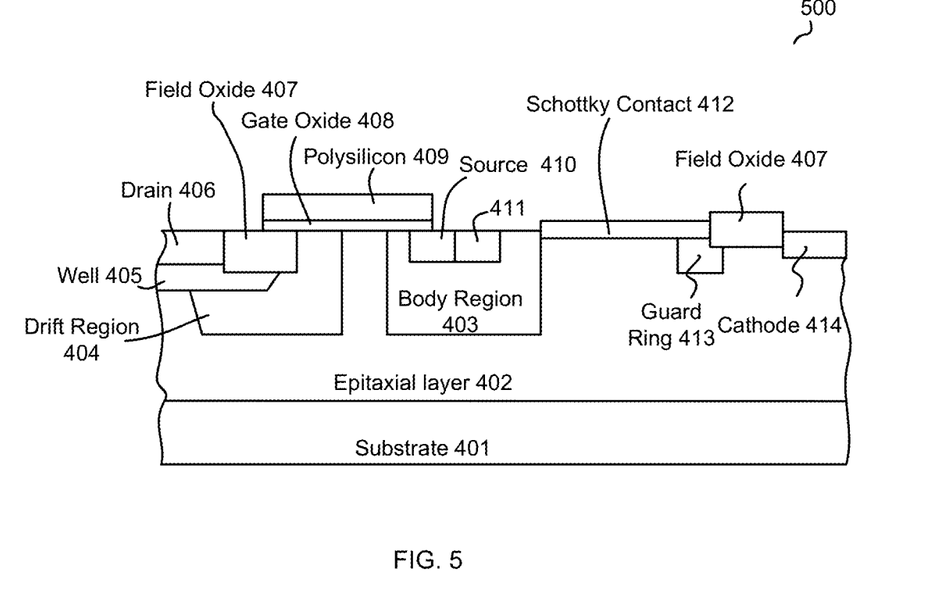
FIG. 5 schematically illustrates a cross-section of the synchronous switch 12 as shown in FIG. 4 according to an embodiment of the present invention.

FIG. 5 schematically illustrates a cross-section of the synchronous switch 12 as shown in FIG. 4 according to an embodiment of the present invention. A Lateral Diffuse Metal Oxide Semiconductor (LDMOS) is configured to illustrate the first semiconductor component 13. An LDMOS cell and a schottky diode are shown in FIG. 5 as examples. According to the distribution of the current I1 flowing through the synchronous switch 12, the area of the first semiconductor component 13 can be increased by increasing the cells of LDMOS, and the area of the second semiconductor component 14 can be increased by increasing the cells of schottky diodes. As shown in FIG. 5, the LDMOS cell comprises a substrate 401 of first doping type, an epitaxial layer 402 of second doping type, a body region 403 of first doping type formed in the epitaxial layer 402, a drift region 404 of second doping type formed in the epitaxial layer 402, a drain region 406 of second doping type formed in the drift region 404, a gate oxide layer 408 and a polysilicon layer 409 formed on the gate oxide layer 408. Wherein the first doping type and the second doping type are different. The first doping type can be P type, and the second doping type can be N type. The LDMOS cell can further comprise a doping region 411 of deep first doping type, a well region 405 of second doping type, and a field oxide layer 407. The schottky diode cell comprises a schottky contact 412, a cathode region 414 of second doping type, the substrate 401, the epitaxial layer 402, and a guard ring 413 formed under the schottky contact 412.

Figure 6:
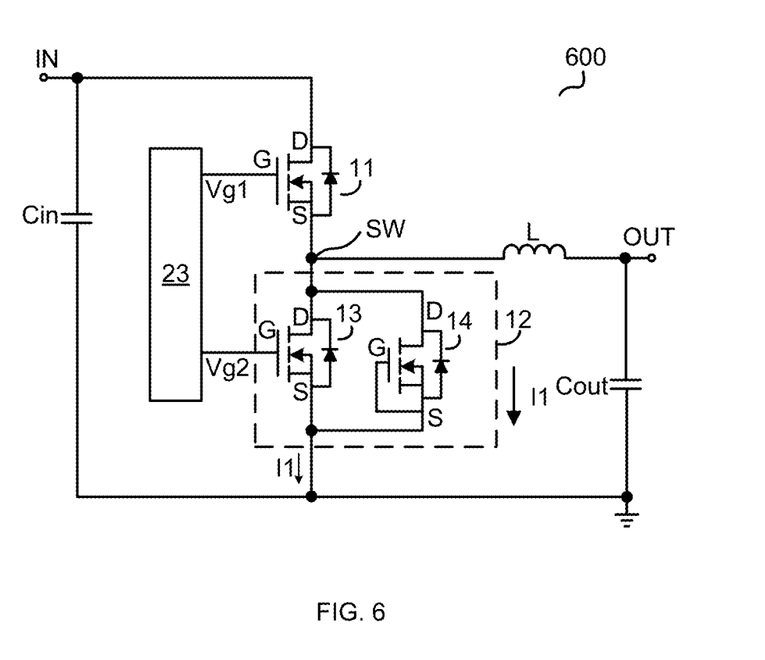
FIG. 6 schematically illustrates a circuit block diagram of a synchronous switching converter 600 according to an embodiment of the present invention.

FIG. 6 schematically illustrates a circuit block diagram of a synchronous switching converter 600 according to an embodiment of the present invention. Compared with the synchronous switch converter 400 as shown in FIG. 4, the second semiconductor component 14 in the synchronous switch converter 600 comprises a second MOSFET with a low threshold voltage, wherein the threshold voltage of the second MOSFET is a lowest voltage needed to turn on the second MOSFET. The second MOSFET comprises a drain D, a source S and a gate G. The drain D of the second MOSFET in the second semiconductor component 14 is coupled to the drain D of the first MOSFET in the first semiconductor component 13, and both of the source S and the gate G of the second MOSFET in the second semiconductor component 14 are coupled to the source S of the first MOSFET in the first semiconductor component 13. The threshold voltage of the second MOSFET in the second semiconductor component 14 is lower than a threshold voltage of the first MOSFET in the first semiconductor component 13, wherein the threshold voltage of the first MOSFET is a lowest voltage needed to turn on the first MOSFET. When the synchronous switch 12 is off, owning to the low threshold voltage of the second MOSFET in the second semiconductor component 14, part of the currents of the inductor L are configured to flow through the second semiconductor component 14, thus reducing the turn on losses and reverse recovery losses of the body diode in the first semiconductor cell 13 and improving the efficiency of the synchronous switching converter 600.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

We claim:

1. An integrated semiconductor device utilized in synchronous switching converters, comprising:
  a first semiconductor component, comprising a first Metal Oxide Semiconductor Field Effect Transistor (MOSFET) with a body diode, wherein the first MOSFET has a source, a drain and a gate; and
  a second semiconductor component, coupled in parallel with the first semiconductor component, wherein the second semiconductor component comprises a diode with an anode and a cathode, wherein the anode of the diode is coupled to the source of the first MOSFET, the cathode of the diode is coupled to the drain of the first MOSFET, wherein a forward voltage of the diode is lower than a forward voltage of the body diode in the first MOSFET; wherein cells of the second semiconductor component are configured to distribute among the first semiconductor component unevenly according to a distribution of a current flowing through the integrated semiconductor device.

2. The integrated semiconductor device utilized in synchronous switching converters of claim 1, wherein the integrated semiconductor device comprises at least a first cell of the second semiconductor component and a second cell of the second semiconductor component, an area of the second cell of the second semiconductor component is larger than an area of the first cell of the second semiconductor component when a current flowing through the second cell of the second semiconductor component is larger than a current flowing through the first cell of the second semiconductor component.

3. The integrated semiconductor device utilized in synchronous switching converters of claim 2, wherein an area ratio of the second semiconductor component to the first semiconductor component is configured to decrease in a first direction, wherein the first direction is perpendicular to a direction of the current flowing through the integrated device.

4. The integrated semiconductor device utilized in synchronous switching converters of claim 2, wherein an area ratio of the second semiconductor component to the first semiconductor is configured to decrease in a second direction, wherein the second direction is parallel to a direction of the current flowing through the integrated device.

5. The integrated semiconductor device utilized in synchronous switching converters of claim 2, wherein the area ratio of the second semiconductor component to the first semiconductor is configured to decrease in both a first direction and a second direction simultaneously, wherein the first direction is perpendicular to a direction of the current flowing through the integrated device, the second direction is parallel to the direction of the current flowing through the integrated device, the first direction is perpendicular to the second direction.

6. The integrated semiconductor device utilized in synchronous switching converters of claim 2, wherein an area ratio of the second semiconductor component to the first semiconductor component is configured to increase in both a first direction and a third direction, wherein both the first direction and the third direction are perpendicular to a direction of the current flowing through the integrated device, the first direction is opposite to the third direction.

7. The integrated semiconductor device utilized in synchronous switching converters of claim 2, wherein an area ratio of the second semiconductor component to the first semiconductor component is configured to increase in both a first direction and a third direction and decrease in a second direction, wherein both the first direction and the third direction are perpendicular to a direction of the current flowing through the integrated device, the second direction is parallel to the direction of the current flowing through the integrated device, the first direction is opposite to the third direction, and the second direction is perpendicular to the first direction and the third direction.

8. An integrated semiconductor device utilized in synchronous switching converters, comprising:

a first semiconductor component, comprising a first Metal Oxide Semiconductor Field Effect Transistor (MOSFET) with a body diode, wherein the first MOSFET has a source, a drain and a gate; and a second semiconductor component, coupled in parallel with the first semiconductor component, wherein the second semiconductor component comprises a second MOSFET, the second MOSFET has a source, a drain and a gate, the drain of the second MOSFET in the second semiconductor component is coupled to the drain of the first MOSFET, both the source and the gate of the second are coupled to the source of the first MOSFET, and a threshold voltage of the second MOSFET is lower than a threshold voltage of the first MOSFET, wherein the threshold voltage of the first MOSFET is a lowest voltage needed to turn on the first MOSFET, the threshold voltage of the second MOSFET is a lowest voltage needed to turn on the second MOSFET; wherein cells of the second semiconductor component are configured to distribute among the first semiconductor component unevenly according to a distribution of a current flowing through the integrated semiconductor device.

9. The integrated semiconductor device utilized in synchronous switching converters of claim 8, wherein the integrated semiconductor device comprises at least a first cell of the second semiconductor component and a second cell of the second semiconductor component, an area of the second cell of the second semiconductor component is larger than an area of the first cell of the second semiconductor component when a current flowing through the second cell of the second semiconductor component is larger than a current flowing through the first cell of the second semiconductor component.

10. A synchronous switching converter, having an input terminal and an output terminal utilized to provide an output signal, the synchronous switching converter comprising:

an input capacitor, having a first terminal and a second terminal, wherein the first terminal is coupled to the input terminal, the second terminal is coupled to a system ground;

a power switch, configured to adjust the output signal;

an inductor, configured to store energy when the power switch is on and release energy when the power switch is off;

a synchronous switch, configured to be an integrated semiconductor device to provide a path for a current of the inductor when the power switch is off, wherein the integrated semiconductor device comprises a first semiconductor component and a second semiconductor component coupled in parallel, cells of the second semiconductor component are configured to distribute among the first semiconductor component unevenly according to a distribution of a current flowing through the inductor; and an output capacitor, having a first terminal and a second terminal, wherein the first terminal of the output capacitor is coupled to the output terminal, the second terminal of the output capacitor is coupled to the system ground.

11. A synchronous switching converter of claim 10, wherein an area of a cell of the second semiconductor component increases when a distance of the cell of a second semiconductor component to the input capacitor increases.

12. A synchronous switching converter of claim 10, comprising a step-down synchronous switching converter, wherein the power switch has a source, a drain and a gate, wherein the drain of the power switch is coupled to the input terminal, the gate of the power switch is configured to receive a first switch control signal;

the synchronous switch has a source, a drain and a gate, wherein the drain of the synchronous switch is coupled to the source of the power switch, the source of the synchronous switch is coupled to the system ground, the gate of the synchronous switch is configured to receive a second switch control signal; and the inductor has a first terminal and a second terminal, wherein the first terminal of the inductor is coupled to both the source of the power switch and the drain of the synchronous switch, the second terminal of the inductor is coupled to the output terminal.

13. A synchronous switching converter of claim 10, wherein the first semiconductor component comprises a first Metal Oxide Semiconductor Field Effect Transistor (MOSFET) with a body diode, wherein the first MOSFET has a source, a drain and a gate; and the second semiconductor component comprises a diode with an anode and a cathode, the anode of the diode is coupled to the source of the first MOSFET, the cathode of the diode is coupled to the drain of the first MOSFET, wherein a forward voltage of the diode is lower than a forward voltage of the body diode in the first MOSFET.

14. A synchronous switching converter of claim 10, wherein the first semiconductor component comprises a first Metal Oxide Semiconductor Field Effect Transistor (MOSFET) with a body diode, wherein the first MOSFET has a source, a drain and a gate; and the second semiconductor component comprises a second MOSFET with a source, a drain and a gate, wherein the drain of the second MOSFET is coupled to the drain of the first MOSFET, both of the source and the gate of the second MOSFET are coupled to the source of the first MOSFET, and a threshold voltage of the second MOSFET is lower than a threshold voltage of the first MOSFET, wherein the threshold voltage of the first MOSFET is a lowest voltage needed to turn on the first MOSFET, the threshold voltage of the second MOSFET is a lowest voltage needed to turn on the second MOSFET.

15. A synchronous switching converter of claim 10, wherein the integrated semiconductor device comprises at least a first cell of the second semiconductor component and a second cell of the second semiconductor component, an area of the second cell of the second semiconductor component is larger than an area of the first cell of the second semiconductor component when a current flowing through the second cell of the second semiconductor component is larger than a current flowing through the first cell of the second semiconductor component.

16. A synchronous switching converter of claim 10, wherein the first semiconductor component with a drain, a source and a gate is integrated by MOSFET cells, wherein each of the MOSFET cells comprises a substrate of first doping type, an epitaxial layer of second doping type, a body region of first doping type formed in the epitaxial layer, a drift region of second doping type formed in the epitaxial layer, a source region of second doping type formed in the body region, a drain region of second doping type formed in the drift region, a gate oxide layer, and a polysilicon layer formed on the gate oxide layer, wherein the first doping type and the second doping type are different; and the second semiconductor component comprises a first region and a second region, wherein the first region is electrically coupled to a drain of the first semiconductor component, and the second region is electrically coupled to a source of the first semiconductor component.

* * * * *